United States Patent
Yaung et al.

(10) Patent No.: US 7,067,891 B2
(45) Date of Patent: Jun. 27, 2006

(54) SENSOR ELEMENT HAVING ELEVATED DIODE WITH SIDEWALL PASSIVATED BOTTOM ELECTRODE

(75) Inventors: Dunn-Nian Yaung, Taipei (TW); Shou-Gwo Wuu, Hsin-Chu (TW); Ho-Ching Chien, Hsinchu (TW); Yi-Shing Chang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 189 days.

(21) Appl. No.: 10/701,670

(22) Filed: Nov. 4, 2003

(65) Prior Publication Data

US 2005/0093086 A1    May 5, 2005

(51) Int. Cl.
*H01L 27/14* (2006.01)
(52) U.S. Cl. .................. 257/414; 257/444; 438/48
(58) Field of Classification Search .............. 257/458
See application file for complete search history.

(56) References Cited

U.S. PATENT DOCUMENTS

| 6,018,187 A | 1/2000 | Theil et al. |
| 6,229,192 B1* | 5/2001 | Gu ............................. 257/458 |
| 6,288,435 B1 | 9/2001 | Mei et al. |
| 6,730,914 B1* | 5/2004 | Chao et al. ............ 250/370.14 |

* cited by examiner

*Primary Examiner*—David Nelms
*Assistant Examiner*—Long Tran
(74) *Attorney, Agent, or Firm*—Thomas, Kayden, Horstemeyer & Risley

(57) ABSTRACT

Each of an elevated diode sensor optoelectronic product and a method for fabricating the elevated diode sensor optoelectronic product employs a sidewall passivation dielectric layer passivating a sidewall of a patterned conductor layer which serves as a bottom electrode for an elevated diode within the elevated diode sensor optoelectronic product. The sidewall passivation dielectric layer eliminates contact between the patterned conductor layer and an intrinsic diode material layer within the elevated diode, thus providing enhanced performance of the elevated diode sensor optoelectronic product.

7 Claims, 4 Drawing Sheets

SENSOR ELEMENT HAVING ELEVATED DIODE WITH SIDEWALL PASSIVATED BOTTOM ELECTRODE

BACKGROUND OF THE INVENTION

1. Field of the Invention

The invention relates generally to diodes, as employed within sensor element structures. More particularly, the present invention relates to diodes with enhanced performance, as employed within sensor element structures.

2. Description of the Related Art

Sensor element structures are optoelectronic structures which sense and classify incident electromagnetic radiation to provide electrical signals which are transported over conductor interconnect structures which connect the sensor element structures. Sensor element structures are often arranged as areal arrays which are employed as active elements within consumer products such as digital cameras.

As sensor element structure density and related conductor interconnect structure density within optoelectronic products has increased, it has become increasingly difficult to fabricate sensor element structures with enhanced performance.

It is towards the foregoing object that the present invention is directed.

Various sensor elements having desirable properties, and methods for fabrication thereof, have been disclosed within the optoelectronic product fabrication art.

Included but not limited among the sensor elements and methods for fabrication thereof are those disclosed within Theil et al., in U.S. Pat. No. 6,018,187 (a PIN diode sensor element structure with a transparent electrode which spans to a conductor interconnect structure); and (2) Mei et al., in U.S. Pat. No. 6,288,435 (a PIN diode sensor element structure having a metal bottom electrode sidewall and edge passivated with an N-amorphous silicon layer of greater linewidth than the metal bottom electrode).

The teachings of each of the foregoing references is incorporated herein fully by reference.

Desirable in the optoelectronic product fabrication art are additional sensor element structures having enhanced performance, and methods for fabrication thereof.

It is towards the foregoing object that the present invention is directed.

SUMMARY OF THE INVENTION

A first object of the invention is to provide a sensor element and a method for fabricating the sensor element.

A second object of the invention is to provide a sensor element and a method for fabricating the sensor element in accord with the first object of the invention, wherein the sensor element is fabricated with enhanced performance.

In accord with the objects of the invention, the invention provides a sensor element and a method for fabricating the sensor element.

In accord with the invention, the method first provides a substrate. The method then provides for forming over the substrate a patterned conductor layer having formed aligned thereupon a patterned first doped diode material layer of a first polarity. The method then provides for forming passivating a sidewall of the patterned conductor layer while leaving exposed a central surface portion of the patterned first doped diode material layer a sidewall passivation dielectric layer. Finally, the method provides for forming upon the sidewall passivation dielectric layer and the exposed central surface portion of the patterned first doped diode material layer an intrinsic diode material layer.

The method for fabricating the sensor element of the invention contemplates the sensor element fabricated in accord with the method for fabricating the sensor element.

The invention provides a sensor element and a method for fabricating the sensor element, wherein the sensor element is fabricated with enhanced performance.

The invention realizes the foregoing object within the context of an elevated diode sensor element formed over a substrate and comprising a patterned conductor layer (which serves as a bottom electrode within the elevated diode) having formed aligned thereupon a patterned first diode material layer of a first polarity. Within the invention, a sidewall passivation dielectric layer is formed passivating a sidewall of the patterned conductor layer and leaving exposed a central surface portion of the patterned first diode material layer, prior to forming upon the sidewall passivation dielectric layer and the central surface portion of the patterned first diode material layer an intrinsic diode material layer. By employing the sidewall passivation dielectric layer, contact of the patterned conductor layer with the intrinsic diode material layer is avoided, and thus leakage there between is attenuated, thus in turn providing a sensor element with enhanced performance.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a sensor element and a method for fabricating the sensor element, wherein the sensor element is fabricated with enhanced performance.

The invention realizes the foregoing object within the context of an elevated diode sensor element formed over a substrate and comprising a patterned conductor layer (which serves as a bottom electrode within the elevated diode) having formed aligned thereupon a patterned first diode material layer of a first polarity. Within the invention, a sidewall passivation dielectric layer is formed passivating a sidewall of the patterned conductor layer and leaving exposed a central surface portion of the patterned first diode material layer, prior to forming upon the sidewall passivation dielectric layer and the central surface portion of the patterned first diode material layer an intrinsic diode material layer. By employing the sidewall passivation dielectric layer, contact of the patterned conductor layer with the intrinsic diode material layer is avoided, and thus leakage there between is attenuated, thus in turn providing a sensor element with enhanced performance.

FIG. 1 to FIG. 7 show a series of schematic cross-sectional diagrams illustrating the results of progressive stages of fabricating within an optoelectronic product a sensor element in accord with a preferred embodiment of the invention.

Figure 1:
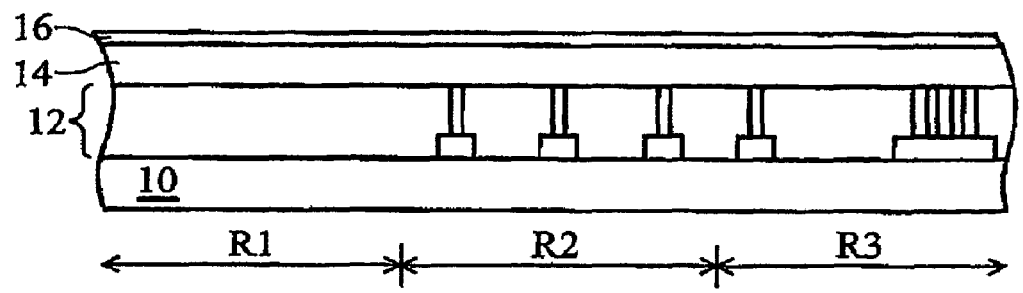
FIG. 1, FIG. 2, FIG. 3, FIG. 4, FIG. 5, FIG. 6 and FIG. 7 show a series of schematic cross-sectional diagrams illustrating the results of progressive stages of fabricating within an optoelectronic product a sensor element in accord with the preferred embodiment of the invention.

FIG. 1 shows a schematic diagram of the optoelectronic product at an early stage in its fabrication in accord with the preferred embodiment of the invention.

FIG. 1 shows a substrate 10 having formed thereupon a dielectric isolated metallization pattern 12, in turn having formed thereupon a blanket conductor layer 14, finally in turn having formed thereupon a blanket first doped diode material layer 16.

Within the invention, the substrate 10 may comprise any of several substrates as may be employed for fabricating optoelectronic products. Such substrates may include, but are not limited to semiconductor substrates and ceramic substrates.

Although not specifically illustrated within the schematic cross-sectional diagram of FIG. 1, the substrate 10, typically and preferably when the substrate 10 comprises a semiconductor substrate as employed within a semiconductor optoelectronic product, has formed therein and/or thereupon microelectronic devices as are otherwise generally conventional within the optoelectronic product within which is employed the substrate 10. Such microelectronic devices may include, but are not limited to resistors, transistors, diodes and capacitors.

Within the invention, the dielectric isolated metallization pattern is comprised of a series of patterned conductor layers (illustrated as the series of narrower layers and studs within the dielectric isolated metallization pattern 12) having formed interposed between their patterns a series of dielectric layers (illustrated as the wider series of layers within the dielectric isolated metallization pattern 12). Within the invention, both the series of patterned conductor layers and the series of patterned dielectric layers may be formed of corresponding conductor materials and dielectric materials as are otherwise conventional in the optoelectronic product fabrication art.

Within the invention, the blanket conductor layer 14 is formed of a conductor material such as but not limited to an aluminum, aluminum alloy, copper or copper alloy conductor material, formed to a thickness of from about 6000 to about 10000 angstroms.

Finally, within the invention the blanket first doped diode material layer 16 is formed employing methods and diode materials as may be conventional in the optoelectronic product fabrication art. Such diode materials may include, but are not limited to amorphous diode materials such as but not limited to amorphous silicon, amorphous germanium, amorphous silicon-germanium, amorphous carbon and amorphous silicon carbide diode materials. More typically, such diode materials are amorphous silicon diode materials. Yet more typically, such diode materials are N doped amorphous silicon diode materials for forming a PIN (top down) elevated diode structure in accord with the preferred embodiment of the invention, although the invention also contemplates the use of P doped amorphous silicon diode materials for forming the first doped diode material layer 16 when forming an NIP (top down) diode structure in accord with the preferred embodiment of the invention. Typically, the blanket first doped diode material layer 16 formed to a thickness of from about 200 to about 500 angstroms and with an appropriate dopant at a concentration of from about 1E18 to about 1E22 dopant atoms per cubic centimeter.

As is finally illustrated within the schematic cross-sectional diagram of FIG. 1, the substrate 10 is divided into three regions. A first region R1 is a peripheral region of the substrate 10. A second region R2 is a sensor region of the substrate 10. A third region R3 is an electrical circuitry region of the substrate 10.

Figure 2:
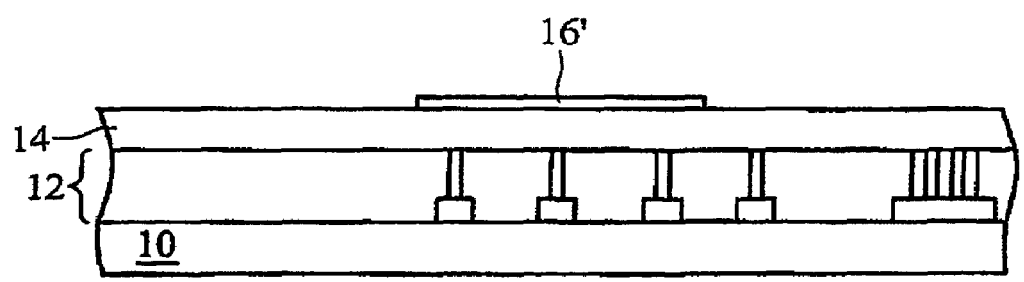

FIG. 2 shows a schematic cross-sectional diagram illustrating the results of further processing of the optoelectronic product of FIG. 1.

FIG. 2 illustrates the results of patterning the blanket first doped diode material layer 16 to form a patterned first doped diode material layer 16' which covers a series of patterned conductor layers within the dielectric isolated metallization pattern 12 in the sensor region R2 of the substrate 10, but not in the peripheral region R1 of the substrate 10 or the circuitry region R3 of the substrate 10.

The blanket first doped diode material layer 16 may be patterned to form the patterned first doped diode material layer 16' while employing photolithographic and etch methods as are conventional in the optoelectronic product fabrication art.

Figure 3:
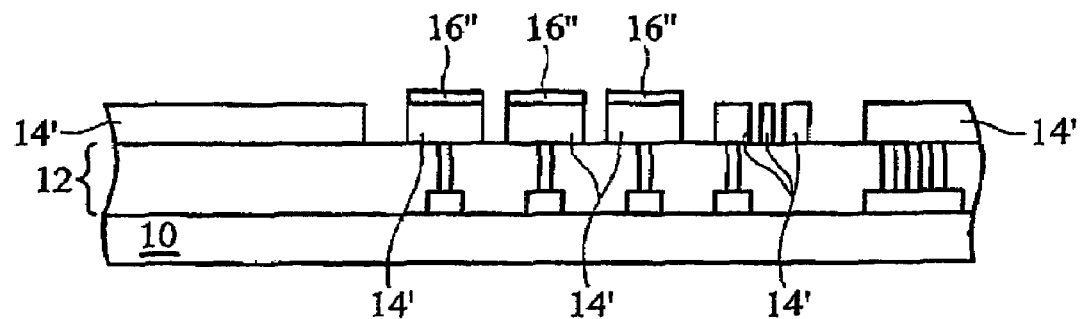

FIG. 3 shows a schematic cross-sectional diagram illustrating the results of further processing of the optoelectronic product of FIG. 2.

FIG. 3 shows the results of: (1) twice patterning the patterned first doped diode material layer 16' to form a series of twice patterned first doped diode material layers 16" within the sensor region R2 of the substrate 10; and (2) patterning the blanket conductor layer 14 to form a series of patterned conductor layers 14' in the peripheral region R1, the sensor region R2 and the circuitry region R3 of the substrate 10.

Within the invention, the patterning of the patterned first doped diode material layer 16' to form the series of twice patterned first doped diode material layers 16" may be effected while employing photolithographic methods and materials analogous, equivalent or identical to those employed for forming the patterned first doped diode material layer 16' from the blanket first doped diode material layer 16.

Within the invention, the blanket conductor layer 14 may be patterned to form the patterned conductor layers 14' while employing methods and materials as are otherwise generally conventional in the optoelectronic product fabrication art.

Within the invention, typically, the patterned first doped diode material layer 16' and the blanket conductor layer 14 are sequentially etched to form the series of twice patterned first doped diode material layers 16" and the patterned first conductor layers 14' while employing a single photomask in conjunction with a sequential pair of appropriate etchants. This provides the series of twice patterned first doped diode material layers 16" formed aligned (i.e. of identical and co-extensive linewidth, and completely laminated) upon the corresponding patterned conductor layers 14'.

Figure 4:
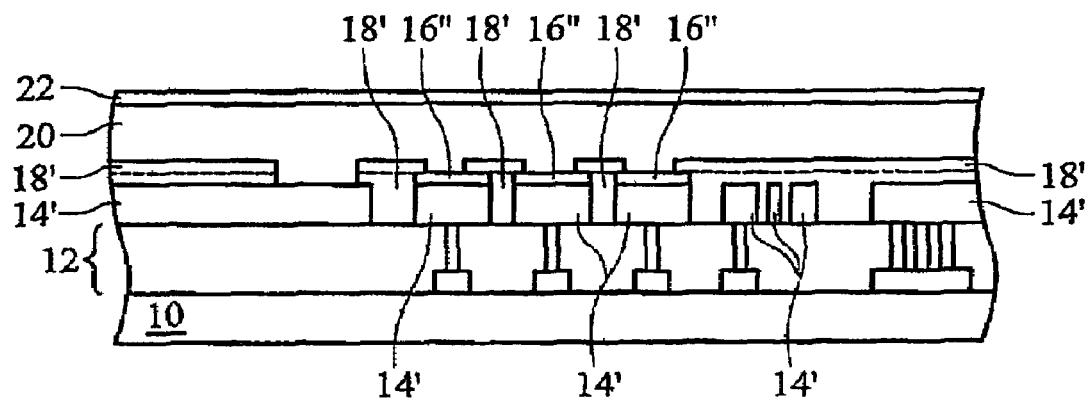

FIG. 4 shows a schematic cross-sectional diagram illustrating the results of further processing of the optoelectronic product of FIG. 3.

FIG. 4 illustrates, in a first instance, a series of patterned dielectric layers 18' in part formed interposed between the series of twice patterned first doped diode material layers 16" and the patterned conductor layers 14' within the sensor region R2 of the substrate 10. As is illustrated in FIG. 4, the series of patterned dielectric layers 18' within the sensor region R2 of the substrate 10 at minimum passivate the sidewalls of the series of patterned conductor layers 14' (i.e. they form patterned conductor layer sidewall passivation layers). Typically, they also passivate the sidewalls of the series of twice patterned first doped diode material layers 16" while leaving exposed a central surface portion of the series of twice patterned first doped diode material layers 16" (i.e, as viewed within the context of a plan-view diagram).

Within the invention, the series of patterned dielectric layers 18' may, as implied within FIG. 4, be formed employing a planarization method which forms a planarized dielectric layer which is subsequently patterned while employing a photolithographic method to form the series of patterned dielectric layers 18'. Alternatively, the series of patterned dielectric layers 18' may be formed of a lesser height than as illustrated in FIG. 4 while employing only a planarizing method while employing the series of twice patterned first doped diode material layers 16" as planarizing stop layers. The lesser height of such patterned dielectric layers is illustrated by a series of phantom dashed lines within the series of patterned dielectric layers 18' as illustrated within FIG. 4. A planarizing method for forming the series of patterned dielectric layers 18' may be appropriate under circumstances where the series of patterned first doped diode material layers 18' is formed of an increased thickness, such as to leave remaining an adequate thickness of the pair of patterned dielectric layers 18' within the peripheral region R1 and the circuitry region R3 of the substrate.

Also shown in FIG. 4 is a blanket intrinsic (i.e., undoped) diode material layer 20 formed upon exposed portions of the patterned dielectric layers 18', the patterned conductor layers 14' and the twice patterned first doped diode material layers 16". Finally shown within FIG. 4 is a blanket second doped diode material layer 22 formed upon the blanket intrinsic diode material layer 20.

Within the invention, the blanket intrinsic diode material layer 20 may be formed employing methods and materials employed for forming the blanket first doped diode material 16, but absent a dopant. Typically, the blanket intrinsic doped diode material layer is formed of a hydrogenated amorphous silicon material, formed to a thickness of from about 8000 to about 25000 angstroms.

Within the invention, the blanket second doped diode material layer 22 may be formed employing methods, materials and dimensions analogous, equivalent or identical to those employed for forming the blanket first doped diode material layer 16, but with a second dopant of polarity opposite the first dopant. Under certain circumstances when thicknesses and dopant concentrations of underlying layers are properly engineered, the blanket second doped diode material layer 22 need not necessarily be required within the invention.

As is understood by a person skilled in the art, within the optoelectronic product as illustrated in FIG. 4, each of the series of twice patterned first doped diode material layers 16", in conjunction with the blanket intrinsic diode material layer 20 and the blanket second doped diode material layer 22 forms a PIN or NIP photodiode which is elevated above the substrate 10 within the sensor region R2 of the substrate.

Figure 5:
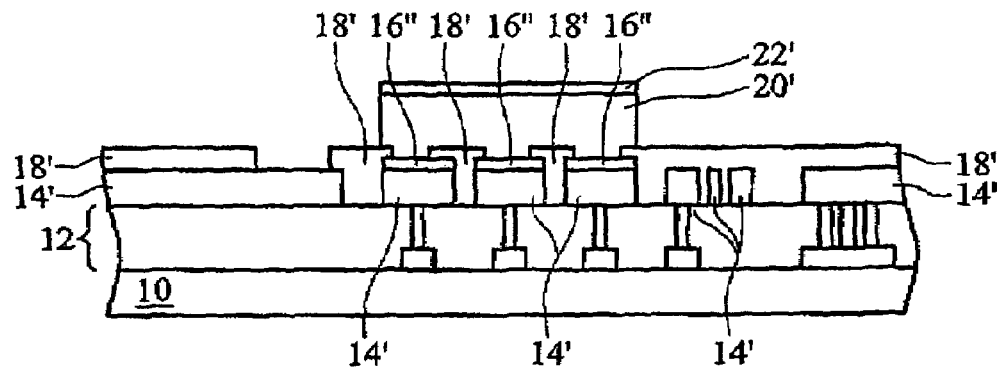

FIG. 5 illustrates a schematic cross-sectional diagram illustrating the results of further processing of the optoelectronic product of FIG. 4.

FIG. 5 illustrates the results of patterning the blanket second doped diode material layer 22 and the blanket intrinsic diode material layer 20 to form a patterned second doped diode material layer 22' aligned upon a patterned intrinsic diode material layer 20' over the sensor region R2 of the substrate 10 but not over the peripheral region R1 or the circuitry region R3 of the substrate 10. Such patterning also leaves exposed a portion of the patterned conductor layer 14' within the peripheral region R1 of the substrate 10.

The patterning of the blanket second doped diode material layer 22 and the blanket intrinsic diode material layer 20 may be effected while employing photolithographic and etch methods as are otherwise generally conventional in the optoelectronic product fabrication art.

Figure 6:
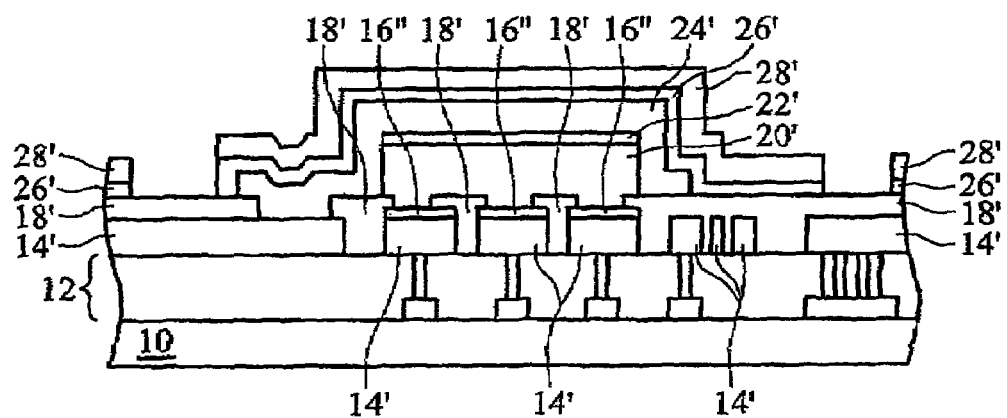

FIG. 6 shows a schematic cross-sectional diagram illustrating the results of further processing of the optoelectronic product of FIG. 5.

FIG. 6 shows the results of forming a patterned transparent electrode layer 24' encapsulating the patterned second doped diode material layer 22' and the patterned intrinsic diode material layer 20' over the sensor region R2 of the substrate 10 and bridging to and contacting the patterned conductor layer 14' within the peripheral region R1 of the substrate 10.

Within the invention, the patterned transparent electrode layer 24' is typically and preferably formed of an indium-tin oxide transparent conductor material, formed to a thickness of from about 2000 to about 8000 angstroms, although other transparent conductor materials may also be employed.

Figure 7:
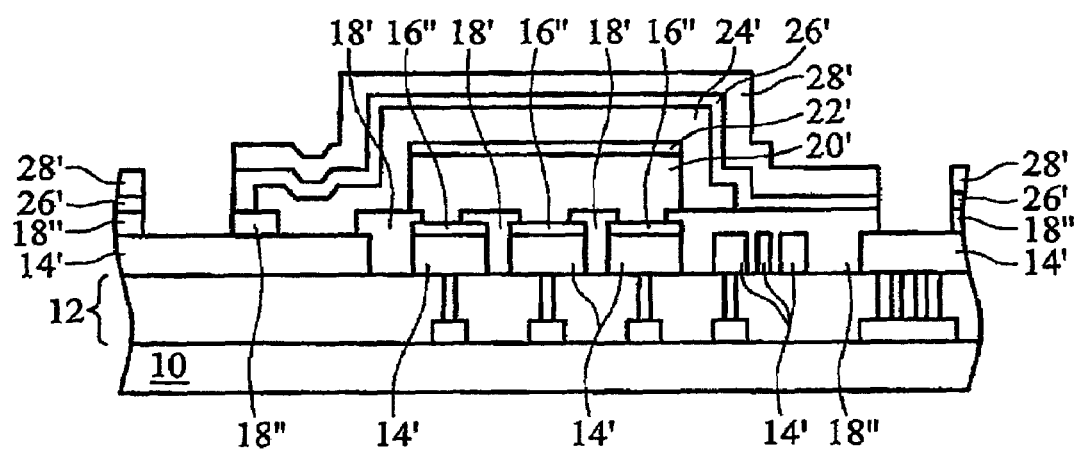

FIG. 7 shows a schematic cross-sectional diagram illustrating the results of further processing of the optoelectronic product of FIG. 6.

FIG. 7 shows the results of: (1) forming over the optoelectronic product of FIG. 6 a series of patterned first terminal dielectric layers 26' having aligned thereupon a series of patterned second terminal dielectric layers 28'; and (2) further etching the pair of patterned dielectric layers 18' within the peripheral region R1 and the circuitry region R3 of the substrate 10 to form a series of twice patterned dielectric layers 18" which leave exposed portions of a pair of patterned conductor layers 14' within the peripheral region R1 and the circuitry region R3 of the substrate 10.

Within the invention, the pair of patterned first terminal dielectric layers 26' is typically formed of a silicon oxide passivation material formed to a thickness of from about 1000 to about 8000 angstroms. Within the invention, the pair of patterned second terminal dielectric layers 28' is typically formed of a silicon nitride passivation material, formed to a thickness of from about 5000 to about 12000 Å. Within the invention, the pair of patterned second terminal dielectric layers 28' and the pair of patterned first terminal dielectric layers 26' are employed as a mask for etching the pair of patterned dielectric layers 18' within the peripheral region R1 and the circuitry region R3 of the substrate 10 when forming therefrom the pair of twice patterned dielectric layers 18".

FIG. 7 illustrates an elevated diode sensor optoelectronic product fabricated in accord with the preferred embodiment of the invention. The elevated diode sensor optoelectronic product has enhanced performance insofar as within a PIN or NIP diode within the elevated diode sensor optoelectronic product a sidewall of a bottom conductor electrode for the PIN diode or NIP diode is sidewall passivated with a patterned dielectric layer such as to attenuate vertical leakage between the bottom conductor electrode and an intrinsic diode material layer formed thereover.

The preferred embodiment of the invention is illustrative of the invention rather than limiting of the invention. Revisions and modifications may be made to materials, structures and dimensions in accord with the preferred embodiment of the invention while still providing a sensor element in accord with the invention, and a method for fabrication thereof, further in accord with the accompanying claims.

What is claimed is:

1. A sensor element, comprising:
    a substrate;
    a patterned conductor layer having formed aligned thereupon a patterned first doped diode material layer of a first polarity, both formed over the substrate;

a sidewall passivation dielectric layer formed passivating a sidewall of the patterned conductor layer and covering edge portions of a top surface of the patterned first doped diode material layer while leaving exposed a central top surface portion thereof;

an intrinsic diode material layer formed upon the sidewall passivation dielectric layer and the exposed central surface portion of the patterned first doped diode material layer.

2. The sensor element of claim 1 further comprising a second doped diode material layer of a second polarity opposite the first polarity formed upon the intrinsic diode material layer.

3. The sensor element of claim 1 further comprising a transparent electrode layer formed over the intrinsic diode material layer.

4. The sensor element of claim 1 wherein the first polarity is an N polarity.

5. The sensor element of claim 1 wherein the first polarity is an P polarity.

6. The sensor element of claim 1 wherein the patterned conductor layer is formed to a thickness of from about 6000 to about 10000 angstroms.

7. The sensor element of claim 1 wherein the first doped diode material layer, the intrinsic diode material layer and the second doped material layer are formed from an amorphous diode material selected from the group consisting of amorphous silicon, amorphous germanium, amorphous silicon-germanium alloy, amorphous carbon and amorphous silicon carbide materials.

* * * * *